United States Patent
Park

(10) Patent No.: US 7,623,381 B2
(45) Date of Patent: Nov. 24, 2009

(54) NON-VOLATILE MEMORY DEVICE AND METHOD OF ERASING THE SAME

(76) Inventor: Seong Hun Park, 195, Seonyeon-ri, Okseo-myeon, Gunsan-si, Jeollabuk-do (KR)

( * ) Notice: Subject to any disclaimer, the term of this patent is extended or adjusted under 35 U.S.C. 154(b) by 41 days.

(21) Appl. No.: 11/617,391

(22) Filed: Dec. 28, 2006

(65) Prior Publication Data

US 2008/0101119 A1   May 1, 2008

(30) Foreign Application Priority Data

Oct. 31, 2006   (KR) .............. 10-2006-0106429

(51) Int. Cl.
*G11C 11/34* (2006.01)
*G11C 16/04* (2006.01)
*G11C 7/00* (2006.01)
*G11C 8/00* (2006.01)

(52) U.S. Cl. .............. 365/185.11; 365/185.13; 365/185.18; 365/185.29; 365/185.33; 365/191; 365/230.03

(58) Field of Classification Search .......... 365/185.11, 365/185.18, 185.29, 185.33, 230.03, 191
See application file for complete search history.

(56) References Cited

U.S. PATENT DOCUMENTS 6,069,039 A * 5/2000 Lee et al. .............. 438/258
6,781,878 B2 * 8/2004 Kleveland et al. ...... 365/185.11
6,940,759 B2 * 9/2005 Tsang et al. ........... 365/185.29
7,012,835 B2 * 3/2006 Gonzalez et al. ....... 365/185.11
7,092,289 B1 * 8/2006 Wong .................... 365/185.09
7,173,852 B2 * 2/2007 Gorobets et al. ....... 365/185.09
7,280,398 B1 * 10/2007 Lee ....................... 365/185.11
2004/0120186 A1 * 6/2004 Fasoli et al. ............. 365/185.2
2004/0233714 A1 * 11/2004 Morikawa et al. ...... 365/185.04
2005/0144358 A1 * 6/2005 Conley et al. ............... 711/103
2005/0144516 A1 * 6/2005 Gonzalez et al. ............. 714/8
2006/0218359 A1 * 9/2006 Sanders et al. ............. 711/154
2007/0263457 A1 * 11/2007 Park ...................... 365/185.33
2008/0052446 A1 * 2/2008 Lasser et al. ................ 711/103

FOREIGN PATENT DOCUMENTS

KR   1020040074142 A   8/2004
KR   1020050004142 A   1/2005

* cited by examiner

*Primary Examiner*—Ly D Pham
(74) *Attorney, Agent, or Firm*—Townsend and Townsend and Crew LLP

(57) ABSTRACT

A non-volatile memory device includes planes, a control logic circuit, a high voltage generator, and a X-decoder. The planes have a plurality of memory cell blocks, respectively. The control logic circuit outputs a row address, which allows a block address to select the same memory cell blocks from different planes at substantially the same time according to an external address signal including the block address and an erase mode bit signal, and an erase instruction signal. The high voltage generator generates erase voltages for an erase operation according to the erase instruction signal. The X-decoder applies the erase voltages to memory cell blocks selected by the row address.

12 Claims, 2 Drawing Sheets

NON-VOLATILE MEMORY DEVICE AND METHOD OF ERASING THE SAME

CROSS-REFERENCES TO RELATED APPLICATIONS

The present application claims priority to Korean patent application number 10-2006-106429, filed on Oct. 31, 2006, which is incorporated by reference in its entirety.

BACKGROUND OF THE INVENTION

The present invention relates to a non-volatile memory device and, more particularly, to a method of erasing which can shorten an erase operation time.

A non-volatile memory device is a device which retains data even though the supply of power is turned off. The flash memory device is a non-volatile memory device, which can be programmed, read, and erased many times through a program operation, a read operation and an erase operation. The erase operation is performed in order to delete stored data. The flash memory device can be classified into NOR flash memory devices and NAND flash memory devices. The erase operation of the NAND flash memory device is described below as an example.

In general, the cell array of the NAND flash memory device is classified into a single-plane type and a multi-plane type. Recently, as the level of integration and the memory capacity increase, the multi-plane type flash memory devices are widely used. The multi-plane type cell array is divided into a number of planes, and each of the planes includes a plurality of blocks. Each block includes a plurality of flash memory cells. The erase operation of the NAND flash memory device is performed on a block basis. At the time of the erase operation, the data of all memory cells included in a selected block are erased.

In the flash memory device, however, the program operation or the erase operation requires a long operating time compared with the operating time of other memory devices. Accordingly, an overall operating speed becomes relatively slow. In the case where a plurality of blocks are erased, a longer operating time is required, reducing the operating speed even more.

BRIEF SUMMARY OF THE INVENTION

The present invention is directed to a non-volatile memory device and a method of erasing, in which the erase operation is performed on a plurality of memory cell blocks at substantially the same time. The memory cell blocks have different plane addresses but have the same block address.

In one embodiment, a non-volatile memory device includes multiple planes, a control logic circuit, a high voltage generator, and a X-decoder. The planes have a plurality of memory cell blocks, respectively. The control logic circuit outputs a row address, which allows a block address to select the same memory cell blocks from different planes at substantially the same time according to an external address signal including the block address and an erase mode bit signal, and an erase instruction signal. The high voltage generator generates erase voltages for an erase operation according to the erase instruction signal. The X-decoder applies the erase voltages to memory cell blocks selected by the row address.

The control logic circuit increases the row address signal when an erase operation on the last memory cell block of the memory cell blocks, which have to be erased within the planes selected according to the erase mode bit signal, is completed.

The control logic circuit further outputs a column address signal according to the external address signal.

In another embodiment, a method of erasing a non-volatile memory device having a multi-plane type memory cell array includes the steps of inputting an erase mode bit signal for deciding a target erase plane, and target erase blocks included in the target erase plane, inputting an external address including a block address, generating a row address signal for selecting first memory cell blocks from the target erase blocks included in the target erase plane at substantially the same time according to the erase mode bit signal and the block address, performing an erase operation on selected memory cell blocks according to the row address signal, and increasing the row address when the erase operation is completed.

The step of inputting the erase mode bit signal includes the steps of inputting a plane select signal for deciding the target erase plane of the planes, inputting a plane dividing signal for deciding a dividing method of the plane, and inputting a block select signal for selecting the target erase blocks of the memory cell blocks included in the target erase plane.

The row address is increased until an erase operation on the last memory cell block of the target erase blocks is completed.

DESCRIPTION OF SPECIFIC EMBODIMENTS

A specific embodiment according to the present patent will be described with reference to the accompanying drawings.

Figure 1:
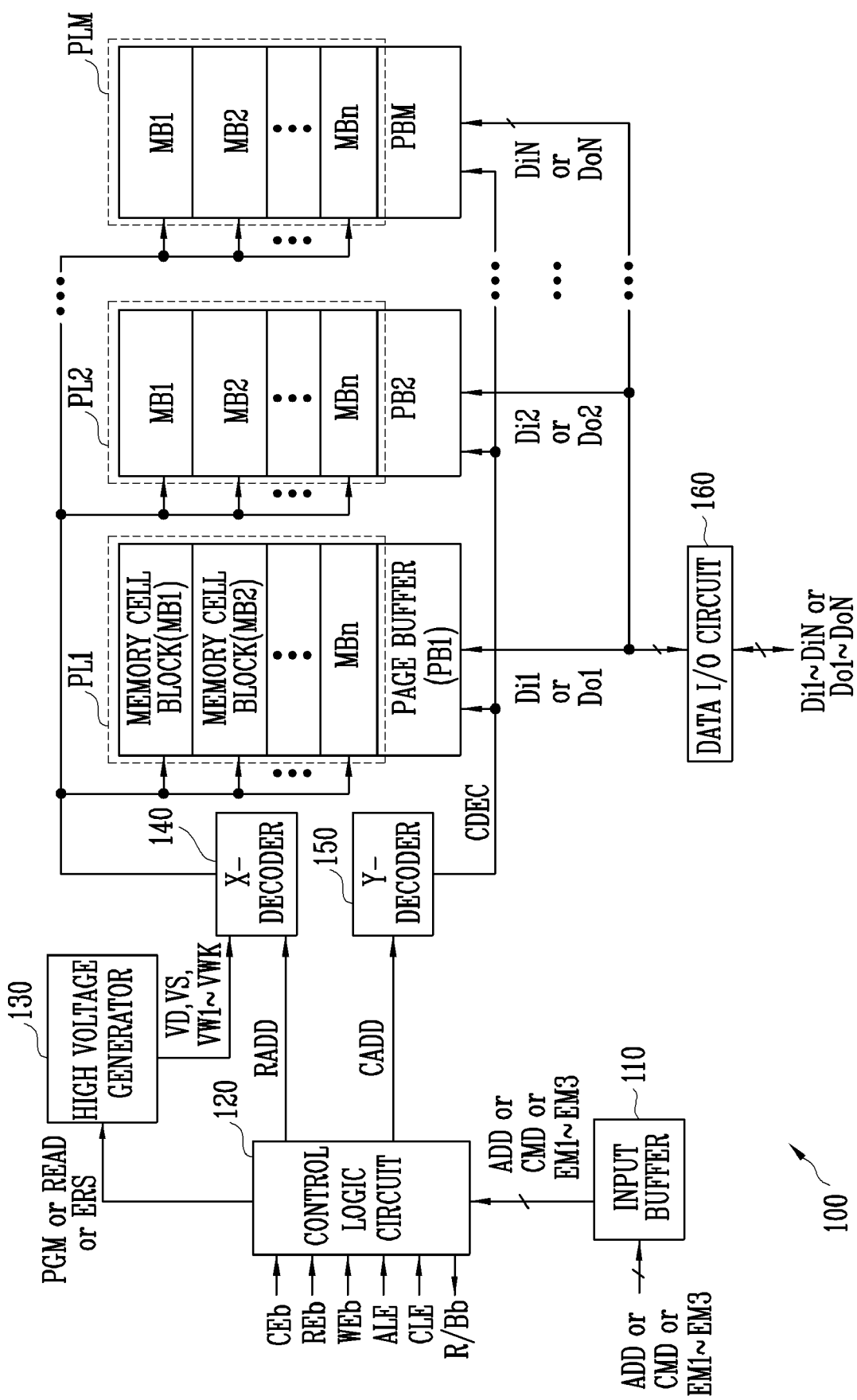
FIG. 1 is a block diagram showing the construction of a non-volatile memory device according to an embodiment of the present invention.

FIG. 1 is a block diagram showing the construction of a non-volatile memory device according to an embodiment of the present invention.

Referring to FIG. 1, a non-volatile memory device 100 includes an input buffer 110, a control logic circuit 120, a high voltage generator 130, an X-decoder 140, a Y-decoder 150, a memory cell array, page buffers PB1 to PBM (M is an integer), and a data I/O circuit 160. The memory cell array includes a plurality of planes PL1 to PLM (M is an integer). Each of the planes includes a plurality of memory cell blocks MB1 to MBn.

The input buffer 110 receives an external address signal ADD, a command signal CMD or erase mode bit signals EM1 to EM3, and outputs them to the control logic circuit 120.

The control logic circuit 120 receives the command signal CMD, the external address signal ADD or the erase mode bit signals EM1 to EM3 in response to a chip enable signal Ceb, and control signals REb, WEb, ALE and CLE. The control logic circuit 120 generates one of a program instruction PGM, a read instruction READ, and an erase instruction ERS in response to the command signal CMD. The control logic circuit 120 also outputs a row address signal RADD and a column address signal CADD according to the external address signal ADD. In addition, if a test mode signal is input as a command signal and the erase mode bit signals EM1 to EM3 and the external address signal ADD are input through the input buffer 110, the control logic circuit 120 of the present invention selects at least one of the planes PL1 to PLM according to the erase mode bit signals EM1 to EM3. The control logic circuit 120 outputs the row address signal RADD, so that memory cell blocks corresponding to a block address included in the external address ADD of the memory cell blocks MB1 to MBn included in a selected plane can be selected at substantially the same time. A detailed operation thereof is described later on with reference to FIG. 2.

The high voltage generator 130 outputs bias voltages VD, VS, and VW1-VWK (K is an integer) in response to one of the program instruction PGM, the read instruction READ and the erase instruction ERS. The voltage VD is voltage to be supplied to a drain select line (not shown), the voltage VS is voltage to be supplied to a source select line (not shown), and the voltages VW1 to VWK are voltages to be supplied to word lines (not shown).

The X-decoder 140 selects at least one of the planes PL1 to PLM according to the row address signal RADD, and supplies the bias voltages VD, VS, and VW1 to VWK from the high voltage generator 130 to memory cell blocks corresponding to a block address included in the external address ADD of the memory cell blocks MB1 to MBn included in a selected plane. A detailed operation thereof is described later on with reference to FIG. 2.

The Y-decoder 150 decodes the column address signal CADD, generates a column decoding signal CDEC, and outputs the column decoding signal CDEC to each of the page buffers PB1 to PBM.

The page buffers PB1 to PBM are disposed in the planes PL1 to PLM, respectively. The page buffers can either latch input data or output data. For input data the page buffers PB1 to PBM latches input data Di1 to DiM (M is an integer), respectively, which are received through the data I/O circuit 160. For output data the page buffers PB1 to PBM selects a part or all of bit lines (not shown) corresponding to planes PL1 to PLM in response to the column decoding signal CDEC, and latches output data Do1 to DoM (M is an integer), respectively, which are received from selected bit lines.

Figure 2:
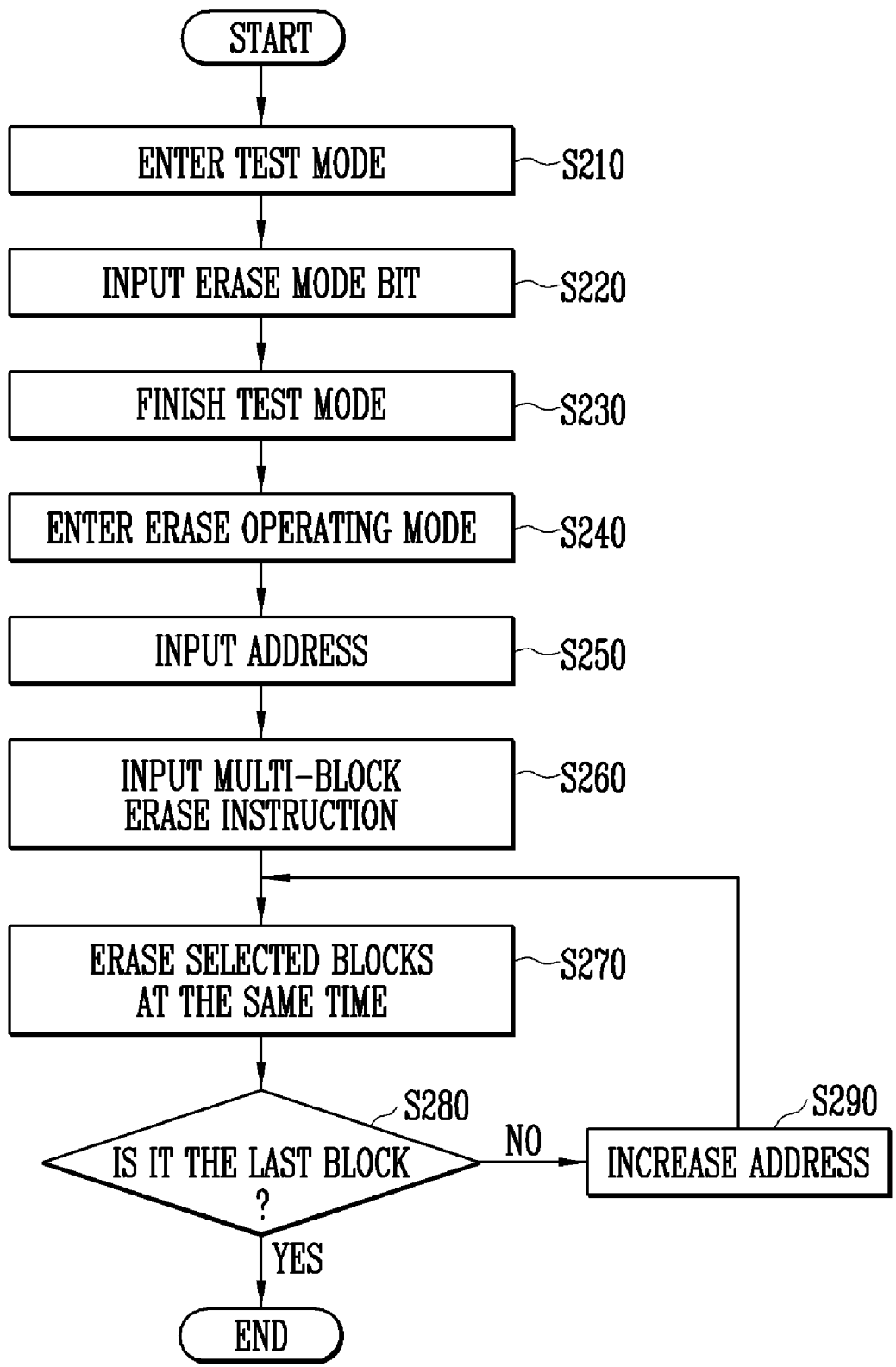
FIG. 2 is a flowchart illustrating a method of erasing the non-volatile memory device according to an embodiment of the present invention.

A method of erasing the non-volatile memory device constructed above is described as follows. FIG. 2 is a flowchart illustrating a method of erasing the non-volatile memory device according to an embodiment of the present invention.

In general, in order to select one memory cell, an address for selecting a specific plane (hereinafter, referred to as "plane address"), an address for selecting a specific block (hereinafter, referred to as "block address"), an address for selecting a specific word line (hereinafter, referred to as "word line address"), and an address for selecting a specific bit line (hereinafter, referred to as "bit line address") are required. The external address signal ADD includes the above addresses. In this case, since the erase operation is performed on a block basis, the plane address and the block address are required.

Meanwhile, the erase operation is performed only on one block. In order to erase blocks included in different planes at substantially the same time, an additional command signal has to be input. For example, a test mode signal, as the command signal, is input into the control logic circuit 120 through the input buffer 110 and the process enters test mode at step S210.

The erase mode bit signals EM1 to EM3 are then input at step S220. The erase mode bit signals include the plane select signal EM1, the plane dividing signal EM2 and the block select signal EM3 as listed in the following Table 1 to Table 3. They are separately input as 2-bit signals.

TABLE 1

| Plane Select Signal (EM1) | Plane Selection Method |
|---|---|
| 00 | One plane |
| 01 | Even planes |
| 10 | Odd planes |
| 11 | All planes |

Referring to Table 1, if the plane select signal EM1 is input, it is determined which one of the plurality of planes PL1 to PLM will be selected according to the plane select signal EM1. For example, if the plane select signal EM1 is input as '00', only one plane corresponding to the external address signal ADD to be input subsequently is selected. If the plane select signal EM1 is input as '01', even planes are selected on the basis of the external address signal ADD to be input subsequently. If the plane select signal EM1 is input as '10', odd planes are selected on the basis of the external address signal ADD to be input subsequently. If the plane select signal EM1 is input as '11', all planes are selected. This means that a selected plane includes a target erase block.

TABLE 2

| Plane Dividing Signal (EM2) | Plane Dividing Method |
|---|---|
| 01 | All plane |
| 10 | Half plane |
| 11 | Quarter plane |

Referring to Table 2, if the plane dividing signal EM2 is input subsequently to the plane select signal EM1, it determines how selected planes will be divided. For example, if the plane dividing signal EM2 is input as '01', all memory cell blocks included in one plane is selected as a target erase group. If the plane dividing signal EM2 is input as '10', one plane is divided into two memory cell blocks. One of two groups is selected as a target erase group according to a block address included in the external address signal ADD to be input subsequently. If the plane dividing signal EM2 is input as '11', one plane is divided into four memory cell blocks. Furthermore, one of four groups is selected as a target erase group according to a block address included in the external address signal ADD to be input subsequently.

TABLE 3

| Block Select Signal (EM3) | Block Selection Method |
|---|---|
| 00 | One block |
| 01 | Even memory cell blocks |
| 10 | Odd blocks |
| 11 | All blocks |

Referring to Table 3, if the block select signal EM3 is input subsequently to the plane dividing signal EM2, it determines which memory cell blocks included in a selected group will be selected according to the plane dividing signal EM3. For example, if the block select signal EM3 is input as '00', only one memory cell block corresponding to the external address signal ADD to be input subsequently is selected. If the block select signal EM3 is input as '01', even memory cell blocks are selected on the basis of the external address signal ADD to be input subsequently within a selected group according to the plane dividing signal EM3. If the block select signal EM3 is input as '10', odd memory cell blocks are selected on the basis of the external address signal ADD to be input subsequently within a selected group according to the plane dividing signal EM3. If the block select signal EM3 is input as '11', the entire memory blocks are selected. In this case, this means that a selected plane includes a target erase block.

It has been described above that the plane selection signal EM1, the plane dividing signal EM2 and the block select signal EM3 are input as 2 bits. However, in order to further divide the selection method or the dividing method, the signals can be input as 2 or more bits. The erase mode bit signals EM1 to EM3 are temporarily stored (e.g., using a latch circuit) in the control logic circuit 120.

If the input of the erase mode bit signals EM1 to EM3 is complete, a signal informing the end of the test mode is input to the command signal at step S230. If a signal for performing the erase operation is input as the command signal, the process enters erase operation mode at step S240. The external address signal ADD for selecting a target erase block is input at step S250. The multi-block erase instruction is input as the command signal at step S260.

If the multi-block erase instruction is input, the control logic circuit 120 outputs the erase instruction signal ERS, the row address signal RADD and the column address signal CADD according to the erase mode bit signals EM1 to EM3 and the external address signal ADD. The erase operation is then performed at step S270. This is described below in more detail.

The control logic circuit 120 selects at least one of the planes PL1 to PLM according to the erase mode bit signals EM1 to EM3. The control logic circuit 120 outputs the row address signal RADD, so that memory cell blocks corresponding to a block address included in the external address ADD of the memory cell blocks MB1 to MBn included in a selected plane are selected at substantially the same time. For example, if the plane select signal EM1 is input as '10', the plane dividing signal EM2 is input as '01', if the block select signal EM3 is input as '01', and the block address is input as a signal for selecting the second memory cell block MB2, the control logic circuit 120 outputs the row address signal RADD so that the second memory cell blocks MB2 of the entire memory cell blocks included in odd planes PLk (k is an odd number) can be selected at substantially the same time.

Furthermore, the voltages VD, VD and VW1 to VWK for the erase operation are applied at substantially the same time from the high voltage generator 130 to the second memory cell blocks MB2 included in odd planes PLk according to the erase instruction signal ERS.

If the erase operation of the second memory cell blocks MB2 included in the odd planes PLk is complete, it is determined whether the memory cell blocks on which the erase operation has been performed correspond to the last cell block at step S280.

In particular, since the block select signal EM3 has been input as '01', the entire even memory cell blocks MBj (j is an even number) included in the odd planes PLk must be erased. Accordingly, it is determined whether the memory cell block MB2 on which the erase operation has been performed corresponds to the last memory cell block of the even memory cell blocks MBj.

If, as a result of the determination, the memory cell block MB2 is not the last memory cell block of the even memory cell blocks MBj, the control logic circuit 120 increases the row address signal RADD at step S290.

In particular, since the block select signal EM3 has been input as '01' and the even memory cell blocks MBj are selected, the control logic circuit 120 increases the row address signal RADD so that a fourth memory cell block MB4 included in the odd planes PLk is selected. The erase operation is performed on the fourth memory cell block MB4 included in the odd planes PLk according to the increased row address signal RADD. Steps S270 to S290 are repeatedly performed until the erase operation is performed on the last even memory cell block of the even memory blocks MBj included in the odd planes PLk.

As described above, according to the present invention, memory cell blocks, which have different plane addresses, but have the same block address, are selected at substantially the same time, and undergo the erase operation. Accordingly, an erase operation time can be shortened.

Furthermore, in a state where a plane on which the erase operation will be performed is selected according to the plane select signal EM1, and the range of a memory cell block on which the erase operation will be performed is set according to the plane dividing signal EM2 and the block select signal EM3, the erase operation is consecutively performed. Accordingly, an erase operation time can be further shortened.

The above embodiments of the present invention are illustrative and various alternatives are possible. Other additions, subtractions, or modifications are obvious in view of the present disclosure and are intended to fall within the scope of the appended claims.

What is claimed is:

1. A non-volatile memory device, comprising:
   a plurality of planes, each plane having a plurality of memory cell blocks;
   a control logic circuit for selecting two or more planes in the plurality planes in response to a plane select signal and an external address signal, for selecting one or more memory cell blocks in each of the selected planes in response to a plane dividing signal and the external address signal, and for selecting at least one target erase block from the selected memory cell blocks in response to a block select signal, wherein the plane select signal, the plane dividing signal and the block select signal are each input as a 2-bit signal;
   a high voltage generator to generate erase voltages for an erase operation according to an erase instruction signal; and
   an X-decoder to simultaneously apply the erase voltages to the one or more blocks in each of the selected planes.

2. The non-volatile memory device of claim 1, wherein the control logic circuit increases a row address signal when an erase operation on the last memory cell block of the selected memory cell blocks is completed.

3. The non-volatile memory device of claim 1, wherein the control logic circuit further outputs a column address signal according to the external address signal.

4. The non-volatile memory device of claim 3, further comprising:
   a Y-decoder to output a column decoder signal according to the column address signal; and
   a plurality of page buffers, each page buffer being disposed corresponding to one of the planes.

5. A method of erasing a non-volatile memory device having a multi-plane type memory cell array, the method comprising:
   inputting a plane select signal for selecting one or more target erase planes in a plurality of planes, wherein the plane select signal is a 2-bit signal;

inputting a plane dividing signal for selecting one or more memory cell blocks in each of the selected target erase planes, wherein the plane dividing signal is a 2-bit signal;

inputting a block select signal for selecting at least one target erase block from the selected memory cells blocks, wherein the block select signal is a 2-bit signal;

inputting an external address including a block address;

generating a row address signal for selecting first memory cell blocks from the selected target erase blocks at substantially the same time according to an erase mode bit signal and the block address;

performing an erase operation on the selected first memory cell blocks according to the row address signal; and increasing the row address after performing the erase operation.

6. The method of claim 5, wherein:

when the plane select signal is input as '00', only one plane is selected, when the plane select signal is input as '01', even planes are selected, when the plane select signal is input as '10', odd planes are selected, and when the plane select signal is input as '11', all of the planes are selected.

7. The method of claim 5, wherein:

when the plane dividing signal is input as '01', all of the memory cell blocks included in each selected target erase plane are selected as a target erase group, when the plane dividing signal is input as '10', each selected target erase plane is divided into two memory cell block groups, wherein one of the two groups is selected as a target erase group, and when the plane dividing signal is input as '11', each selected target erase plane is divided into four memory cell block groups, wherein one of the four groups is selected as a target erase group.

8. The method of claim 7, wherein one of the two groups or four groups is selected as the target erase group according to the block address.

9. The method of claim 5, wherein:

when the block select signal is selected as '00', one memory cell block is selected as the target erase block, when the block select signal is selected as '01', even memory cell blocks are selected as the target erase blocks, when the block select signal is selected as '10', odd memory cell blocks are selected as the target erase blocks, and when the block select signal is selected as '11', all of the selected memory cell blocks are selected as the target erase blocks.

10. The method of claim 5, wherein the row address is increased until an erase operation on the last memory cell block of the target erase blocks is completed.

11. The non-volatile memory device of claim 1, wherein the plane dividing signal is inputted after the plane select signal.

12. The method of claim 5, wherein the plane dividing signal is inputted after the plane select signal.

* * * * *